(12) United States Patent
Hsieh et al.

(10) Patent No.: US 10,754,400 B2
(45) Date of Patent: Aug. 25, 2020

(54) CONTROL METHOD FOR DATA STORAGE SYSTEM, DATA STORAGE MODULE, AND COMPUTER PROGRAM PRODUCT

(71) Applicant: Wiwynn Corporation, New Taipei (TW)

(72) Inventors: Cheng Kuang Hsieh, New Taipei (TW); Kai Sheng Chen, New Taipei (TW); Chia Ming Tsai, New Taipei (TW); Yi-Hao Chen, New Taipei (TW)

(73) Assignee: WIWYNN CORPORATION, New Taipei (TW)

( * ) Notice: Subject to any disclaimer, the term of this patent is extended or adjusted under 35 U.S.C. 154(b) by 2 days.

(21) Appl. No.: 16/218,230

(22) Filed: Dec. 12, 2018

(65) Prior Publication Data

US 2020/0057478 A1    Feb. 20, 2020

(30) Foreign Application Priority Data

Aug. 17, 2018    (TW) .............................. 107128803 A

(51) Int. Cl.
| | | |
|---|---|---|
| G06F 11/30 | (2006.01) | |
| G06F 11/34 | (2006.01) | |
| G06F 3/06 | (2006.01) | |
| G06F 1/20 | (2006.01) | |
| H05K 7/20 | (2006.01) | |

(52) U.S. Cl.
CPC .............. G06F 1/206 (2013.01); G06F 3/061 (2013.01); G06F 3/0653 (2013.01); G06F 3/0674 (2013.01); G06F 11/3058 (2013.01); G06F 11/3419 (2013.01); G06F 11/3428 (2013.01); H05K 7/20209 (2013.01)

(58) Field of Classification Search
CPC ........ G06F 1/206; G06F 3/061; G06F 3/0653; G06F 3/0674; G06F 11/3058; G06F 11/3419; G06F 11/3428; H05K 7/20209
USPC .............................................................. 700/3
See application file for complete search history.

(56) References Cited

U.S. PATENT DOCUMENTS

| | | | | |
|---|---|---|---|---|
| 8,462,459 | B1 | 6/2013 | Lin | |
| 8,824,261 | B1* | 9/2014 | Miller | G11B 33/142 360/97.19 |
| 2008/0189578 | A1* | 8/2008 | Raghuraman | G06F 11/004 714/47.1 |
| 2009/0015241 | A1* | 1/2009 | Gross | G01P 3/48 324/166 |
| 2013/0258521 | A1* | 10/2013 | Yang | G11B 33/144 360/97.13 |
| 2013/0269030 | A1* | 10/2013 | Milford | G06F 21/50 726/22 |
| 2013/0317657 | A1* | 11/2013 | Mundt | G05B 5/01 700/280 |
| 2015/0019917 | A1* | 1/2015 | Fahimi | G06F 11/3096 714/42 |
| 2017/0160771 | A1* | 6/2017 | Albrecht | G06F 1/206 |
| 2019/0154496 | A1* | 5/2019 | Huang | G01H 3/08 |

FOREIGN PATENT DOCUMENTS

| | | |
|---|---|---|
| CN | 105446658 A | 3/2016 |
| TW | I585675 B | 6/2017 |

* cited by examiner

*Primary Examiner* — Ly D Pham

(57) ABSTRACT

A control method for data storage system includes obtaining a correlation coefficient corresponding to storage devices using a control device, and adjusting the link speed of one of the storage devices using the control device.

15 Claims, 6 Drawing Sheets

CONTROL METHOD FOR DATA STORAGE SYSTEM, DATA STORAGE MODULE, AND COMPUTER PROGRAM PRODUCT

CROSS-REFERENCE TO RELATED APPLICATIONS

This application claims priority of Taiwan Patent Application No. 107128803 filed on Aug. 17, 2018, the entirety of which is incorporated by reference herein.

BACKGROUND OF THE INVENTION

Field of the Invention

The present disclosure relates to a control method for a data storage system, a data storage module, and a computer program product.

Description of the Related Art

A data storage center used in the prior art has many data storage apparatuses for storing a large amount of digital data. Each data storage apparatus has a large number of hard disks. In general, there are more than a hundred hard disks in a data storage apparatus. However, when a large number of hard disks operate at high speed, they generate a great amount of heat. Therefore, multiple fans are disposed in the data storage apparatus to dissipate the heat of the hard disks. However, when the rotation speed of the fans increases, resonance may occur, which can cause the performance of some hard disks to suffer drastically, thereby affecting the performance of the data storage apparatus.

BRIEF SUMMARY OF THE INVENTION

The present disclosure provides a control method of a data storage system, a data storage module, and a computer program product. The data storage module of the present disclosure may reduce the effects of the resonance of the fans on the performance of the data storage module according to the operation of the fans and the storage devices.

The present disclosure provides a control method of a data storage system that includes using a control device to obtain the correlation coefficient of a plurality of storage devices; and using the control device to adjust the link speed of one of the storage devices.

In some embodiments, the correlation coefficients correspond to a plurality of performance comparison values and a plurality of position parameters of the storage devices. Each of the position parameters corresponds to the distance between the storage device and a fan, wherein the control device downgrades the link speed according to the correlation coefficient.

In some embodiments, the control method of the data storage system further includes setting the position parameters for each of the storage devices via the control device; and obtaining the performance comparison values of each of the storage devices via the control device.

In some embodiments, the link speed is downgraded in response to the correlation coefficient is greater than a predetermined correlation value.

In some embodiments, the rotation speed of a fan is decreased by the control device according to the correlation coefficient. In some embodiments, the storage devices are hard-disk drives.

In some embodiments, the control method of the data storage system further includes obtaining a plurality of critical temperature values of the storage devices via the control device; and increasing the rotation speed of a fan using the control device in response to the operating temperature of one of the storage devices exceeds the critical temperature value of the storage device.

In some embodiments, the control method of the data storage system further includes obtaining a plurality of benchmark performance values of the storage devices; obtaining a plurality of actual performance values of the storage devices; and obtaining the performance comparison values of the storage devices using the control device according to the actual performance values and the benchmark performances.

In some embodiments, the performance comparison value of one of the storage devices is obtained by calculating the difference between the benchmark performance and the actual performance value of the storage device.

In some embodiments, the distance between the storage device that is downgraded by the link speed and the fan is less than the distances between the remaining storage devices and the fan. In some embodiments, the performance comparison value of the storage device that is downgraded by the link speed is greater than the performance comparison values of the remaining storage devices.

The present disclosure provides a data storage module including storage device, fans and a control device. The fans are adjacent to the storage devices. The control device is electrically connected to the storage devices and the fans. The storage devices and one of the fans are sequentially arranged in an arrangement direction. The control device adjusts the link speed of one of the storage devices or the rotation speed of the fan according to the correlation coefficient of the storage devices.

In some embodiments, the data storage module further includes a housing detachably disposed in a chassis, wherein the storage devices and the fans are disposed in the housing.

In some embodiments, each of the storage devices corresponds to the performance comparison value and the position parameter. Each of the position parameters corresponds to the distance between the storage device and the fan. The performance comparison values and the position parameters correspond to the correlation coefficient.

The present disclosure provides a computer program product. The computer program product is loaded via a processor to execute the control method of the data storage system as claimed in claim 1.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following disclosure provides many different embodiments, or examples, for implementing different features of the present disclosure. Specific examples of components and arrangements are described below to simplify the present disclosure. For example, the formation of a first feature over or on a second feature in the description that follows may include embodiments in which the first and second features are formed in direct contact, and may also include embodiments in which additional features may be formed between the first and second features, such that the first and second features may not be in direct contact.

Figure 1:
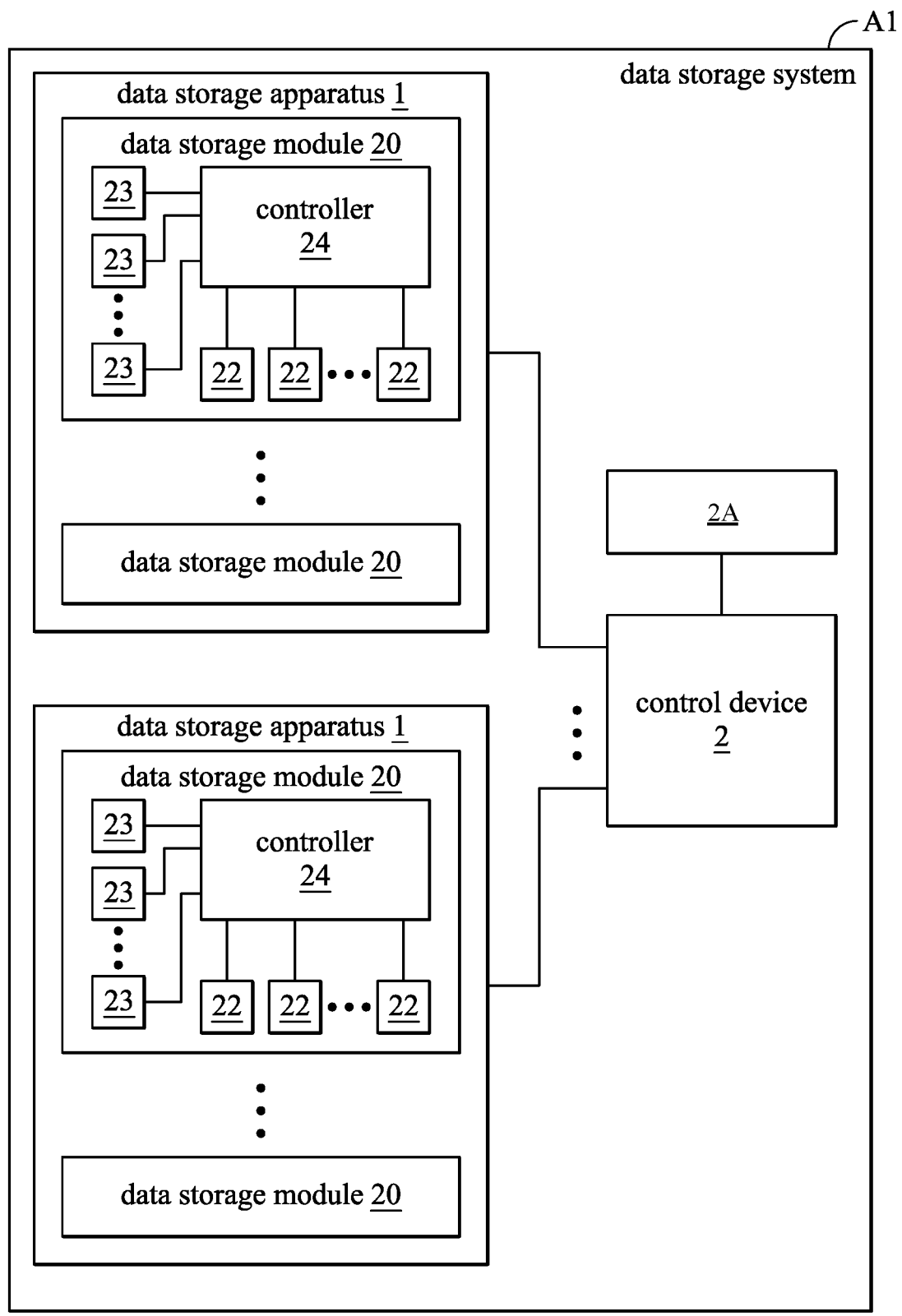
FIG. 1 is a schematic view of the data storage system in accordance with some embodiments of the disclosure.
Figure 2:
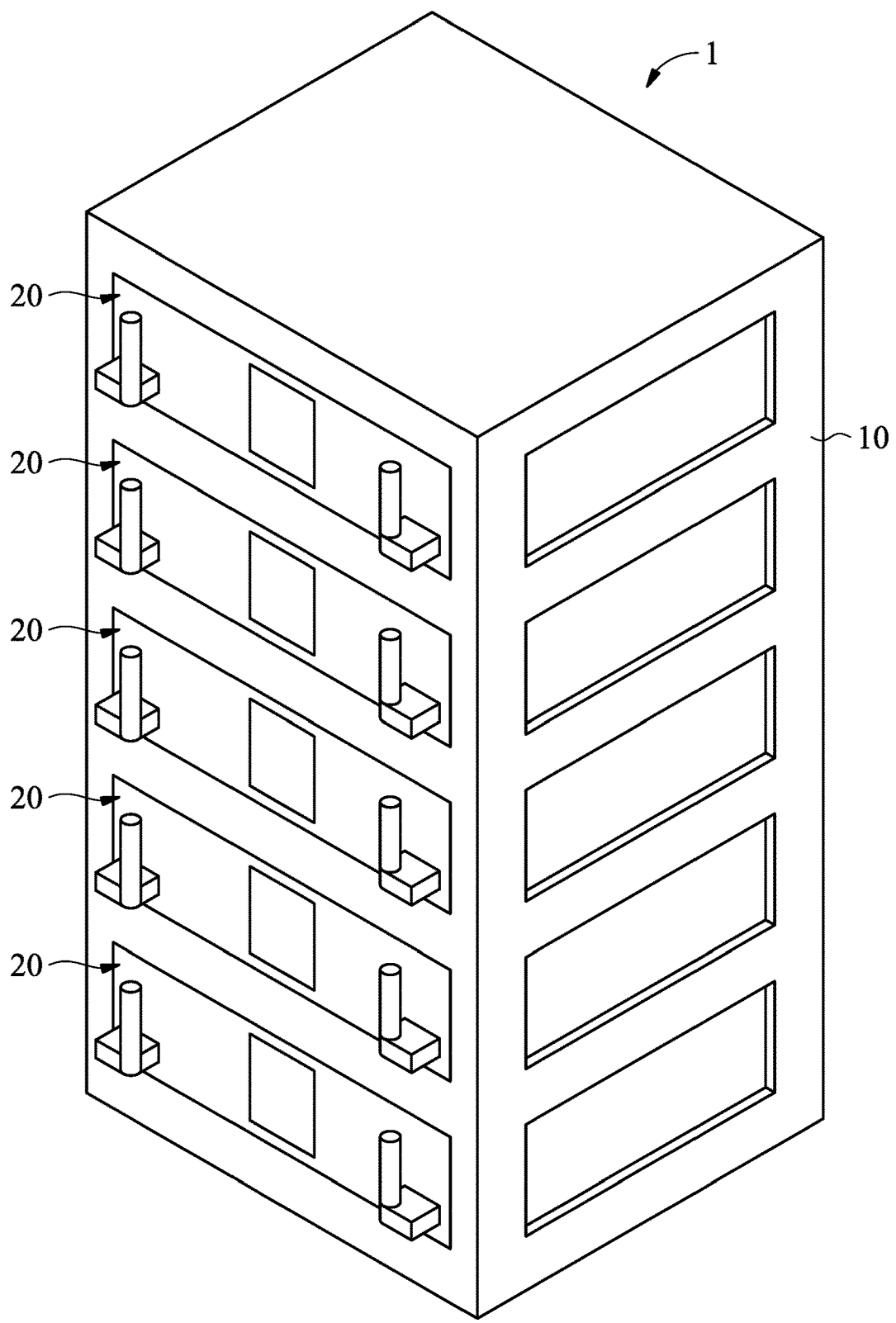
FIG. 2 is a perspective view of the data storage apparatus in accordance with some embodiments of the disclosure.
Figure 3:
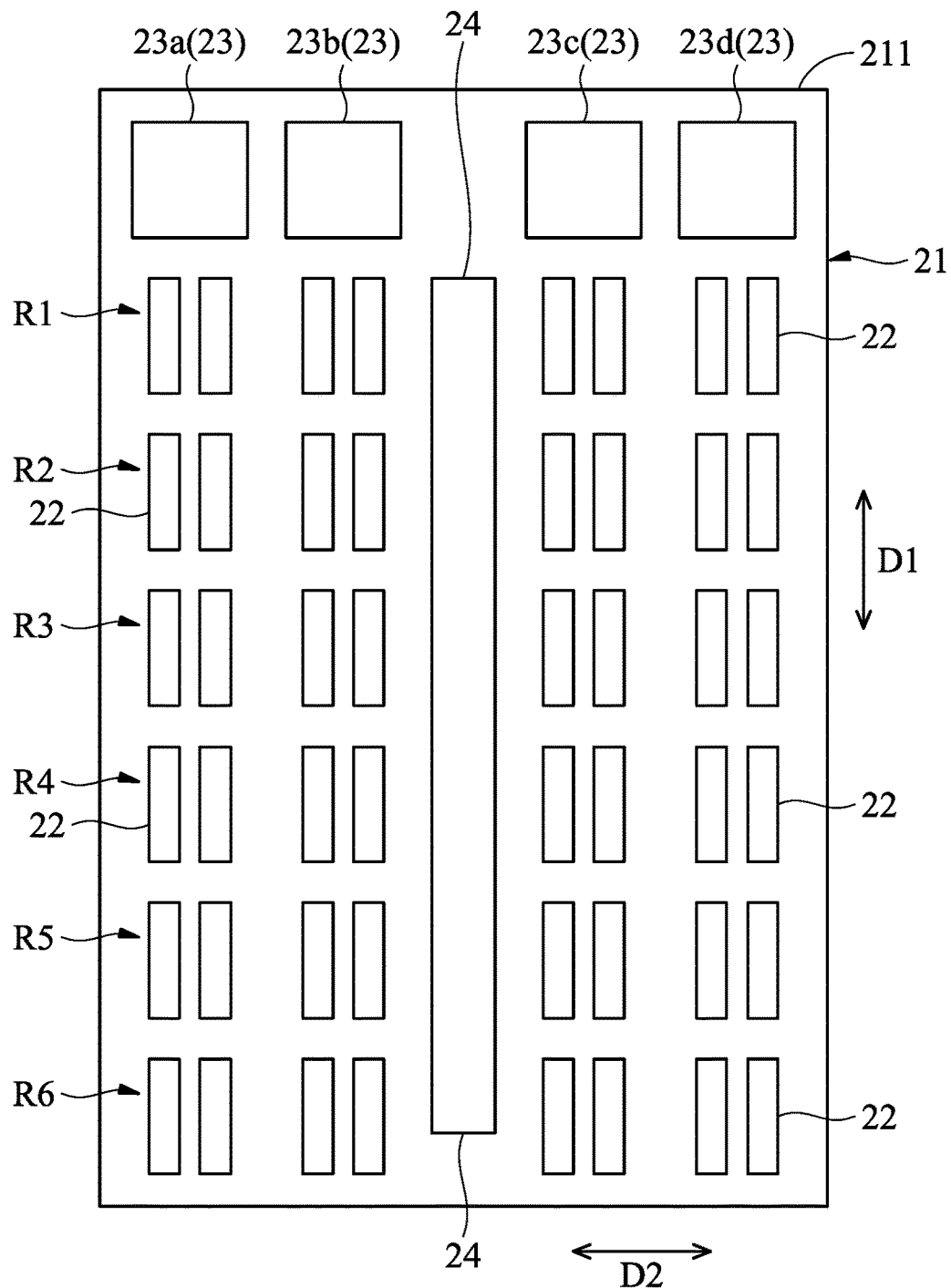
FIG. 3 is a schematic view of the data storage module in accordance with some embodiments of the disclosure.

FIG. 1 is a schematic view of the data storage system A1 in accordance with some embodiments of the disclosure. FIG. 2 is a perspective view of the data storage apparatus 1 in accordance with some embodiments of the disclosure. FIG. 3 is a schematic view of the data storage module 20 in accordance with some embodiments of the disclosure. The data storage system A1 includes data storage apparatuses 1 and a control device 2. The data storage apparatuses 1 may be data servers configured to storage digital data. The control device 2 is electrically connected to the data storage apparatuses 1, and configured to control the data storage apparatuses 1. In some embodiments, the control device 2 is a computer.

External electronic devices (not shown in figures) can be connected to the data storage apparatuses 1 via the control device 2, and can transfer digital data to the data storage apparatuses 1 for storage, or to obtain digital data from the data storage apparatuses 1. For example, the external electronic devices may be personal computers or mobile devices. The external electronic device may be connected to the data storage apparatuses 1 via the Internet.

Each data storage apparatus 1 includes a chassis 10 and data storage modules 20. The data storage modules 20 are detachably disposed in the chassis 10. Each data storage module 20 includes a housing 21, storage devices 22, fans 23, and controllers 24. The housing 21 is detachably disposed on the chassis 10. The storage devices 22 are disposed in the housing 21. The storage devices 22 may be arranged in the housing 21 in an array. In the embodiment, the storage devices 22 are arranged along an arrangement direction D1 and an arrangement direction D2.

Each storage device 22 may be a hard-disk drive (HDD) or a solid-state disk (SDD), configured to storage digital data. For example, the physical structure of a hard-disk drive generally includes a magnetic head, a disk, a main motor, a secondary motor, a main control chip, and a cable. When the main motor rotate the disk, the secondary motor drives the magnetic head onto the corresponding disc and read the digital data on the read disc. The magnetic head is suspended on the surface of the disc to draw a circular track (magnetic track) concentric with the disc. At this time, the magnetic induction coil of the magnetic head senses the magnetic property on the disc to position the magnetic region with a predetermined reading time or data interval, thereby obtaining the data content of the magnetic region. When the storage device 22 is subjected to a large vibration, it may cause the data disc to sway, thereby increasing the error rate of the storage device 22 when reading and writing, so that the operation efficiency of the storage device 22 is degraded.

The fans 23 are disposed in the housing 21, and adjacent to the rear side 211 of the housing 21. In the embodiment, the fans 23 are adjacent to the storage devices 22. The fans 23 are arranged in the arrangement direction D2, and the storage devices 22 may not be located between the fans 23. Each fan 23 generates an airflow to the storage devices 22 in the arrangement direction D1, thereby dissipating the heat of the storage devices 22. In the embodiment, each of the fans 23 is arranged with a number of storage devices 22 in the arrangement direction D1.

The controllers 24 are electrically connected to the storage devices 22 and the fans 23. The controllers 24 can be used to transfer digital data to the storage devices 22, or to transfer digital data from the data storage apparatus 1 to external electronic devices. In some embodiments, the controllers 24 may be network cards and/or hard-disk control cards.

The control device 2 can be electrically connected to the controllers 24 of each storage device 22, and controls the link speed of the storage devices 22 and the rotation speed of the fans 23 via the controllers 24. In some embodiments, the data storage system A1 includes a number of control devices 2. Each control devices 2 are electrically connected to the controllers 24 of corresponding storage devices 22. In some embodiments, the control devices 2 can be integrated into individual controllers 24.

When the storage devices 22 in one data storage module 20 perform a large amount of data transmission, the storage devices 22 generate a large amount of heat. In order to dissipate the heat of the storage devices 22, the rotation speed of the fans 23 may be increased. However, after the rotation speed of the fans 23 is increased, the fans 23 may resonate with the housing 21. When the storage devices 22 are hard-disk drives, the operational efficiency is greatly reduced due to the vibration caused by the fans 23. The operational efficiency of the data storage module 20 may be improved by the following control method for the data storage system A1 of the disclosure.

Figure 4:
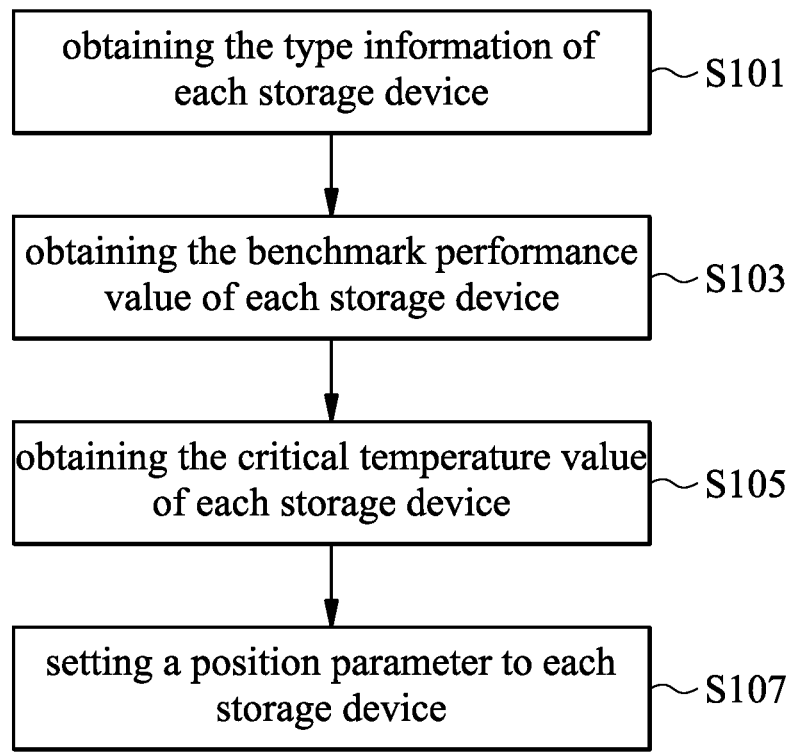
FIG. 4 is a flow chart of the data storage system in accordance with some embodiments of the disclosure.

FIG. 4 is a flow chart of the data storage system A1 in accordance with some embodiments of the disclosure. The disclosed features may be combined, modified, or replaced in any suitable manner in one or more disclosed embodiments, but are not limited to any particular embodiments.

In the embodiment, the following control method of the data storage system Al can be executed via a computer program product 2A. In some embodiments, the computer program product 2A can be loaded via the processor of the control device 2 to execute the control method of the data storage system Al. First, the setting phase of the control method of the data storage system Al is performed. The setting phase can be performed after the data storage apparatus 1 is completed, or after the replacement of the storage device 22.

In step S101, the control device 2 obtains the type information of each storage device 22. For example, in general, the firmware of the storage device 22 stores specifications of the storage device 22, such as model, type information, superheat data, rotation speed, and transmission specifications. In this step, the firmware of each storage device 22 can be read by the control device 2 to obtain the specifications of the storage device 22, such as type information. In the embodiment, the type of the storage device 22 (corresponding to the type information) may be a hard-disk drive or a solid-state disk.

In step S103, the control device 2 performs a performance test on the storage devices 22 and obtains the benchmark performance of each of the storage devices 22. In the embodiment, the performance test may be a read/write speed test, and the benchmark performance may be the read/write speed. The control device 2 may test the amount of digital data that storage devices 22 can read/write per second. For example, the benchmark performance of one of the storage devices 22 can be 100 MB/s. Moreover, when the type of the storage device 22 is a solid-state disk, the test of step S103 may not be performed, and the control device 2 may not need to obtain the benchmark performance of the solid-state disk. Since the solid-state disk does not have a motor and a disc, the solid-state disk is not directly affected by the vibration generated by the fans 23.

In step S105, the control device 2 queries the specifications of each storage device 22 to obtain the critical temperature value of each storage device 22. For example, one of the storage devices 22 may have a critical temperature value of 60° C. When the operating temperature of the storage device 22 exceeds 60° C., the storage device 22 may not work properly or be damaged. Therefore, when the operating temperature of the storage device 22 exceeds 60° C., the storage device 22 will actively reduce the operational efficiency, thereby lowering the temperature of the storage device 22.

In step S107, the control device 2 sets a position parameter for each storage device 22. The position parameter corresponds to the distance between the fan 23 and the storage device 22 in the arrangement direction D1. In some embodiments, the position parameter may be a positive integer. Table 1 is a comparison table of the storage devices 22 and the position parameters in accordance with some embodiments according to FIG. 3. The values from 1 to 6 in Table 1 represent the position parameter.

TABLE 1

| | fan 23a | | fan 23b | | fan 23c | | fan 23d | |
|---|---|---|---|---|---|---|---|---|
| first row R1 | 6 | 6 | 6 | 6 | 6 | 6 | 6 | 6 |
| second row R2 | 5 | 5 | 5 | 5 | 5 | 5 | 5 | 5 |
| third row R3 | 4 | 4 | 4 | 4 | 4 | 4 | 4 | 4 |
| fourth row R4 | 3 | 3 | 3 | 3 | 3 | 3 | 3 | 3 |
| fifth row R5 | 2 | 2 | 2 | 2 | 2 | 2 | 2 | 2 |
| sixth row R6 | 1 | 1 | 1 | 1 | 1 | 1 | 1 | 1 |

In the embodiment, according to the distances between the storage devices 22 and the fan 23 in the arrangement direction D1, each storage device is defined as the storage device 22 in the first row R1, the storage device 22 in the second row R2, the storage device 22 in the third row R3, the storage device 22 in the fourth row R4, the storage device 22 in the fifth row R5, or the storage device 22 in the sixth row R6. For example, the storage device 22 in the first row R1 has the shortest distance between the storage device 22 and the fan 23 in the arrangement direction D1. The storage device 22 in the sixth row R6 has the longest distance between the storage device 22 and the fan 23 in the arrangement direction D1.

In the embodiment, the data storage module 20 has six rows of storage devices 22, but it is not limited thereto. In some embodiments, the data storage module 20 may have at least three rows of storage devices 22. Moreover, in the embodiment, the data storage module 20 has eight columns of the storage devices 22, but it is not limited thereto. In some embodiments, the data storage module 20 has at least three columns of the storage devices 22.

In the embodiment, the closer the storage device 22 to the fan 23 in the arrangement direction D1 has a larger position parameter. For example, the position parameter of the storage devices 22 in the first row R1 is 6. The position parameter of the storage devices 22 in the second row R2 is 5. The position parameter of the storage devices 22 in the third row R3 is 4. The position parameter of the storage devices 22 in the fourth row R4 is 3. The position parameter of the storage devices 22 in the fifth row R5 is 2. The position parameter of the storage devices 22 in the sixth row R6 is 1.

In some embodiments, since the locations of the data storage modules 20 in the data storage apparatus 1 are different, the position parameters can be adjusted according to the positions of the data storage modules 20 in the data storage apparatus 1. For example, each storage device 22 has a first position parameter and a second position parameter. The first position parameter corresponds to the distances between the storage device 22 and the fan 23 in the arrangement direction D1. The second position parameter corresponds to the location of the data storage module 20 located in the data storage apparatus 1.

Moreover, since the locations of the data storage apparatuses 1 in the data storage system A1 are different, the position parameters can be adjusted according to the positions of the data storage apparatuses 1 in the data storage system A1. For example, each storage device 22 further has a third position parameter. The third position parameter corresponds to the position of the data storage apparatuses 1 in the data storage system A1.

Figure 5:
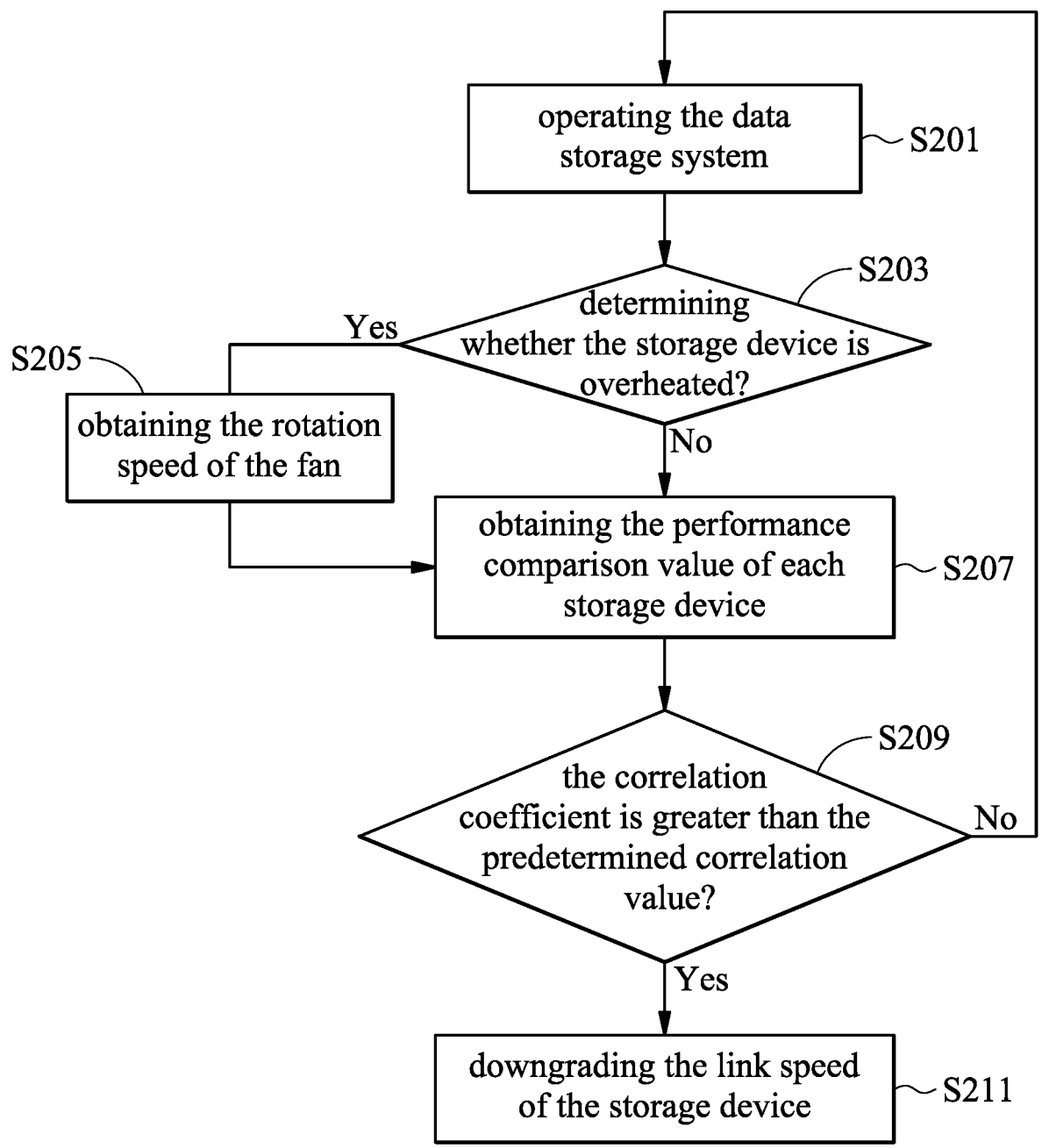
FIG. 5 is a flow chart of the control method of the data storage system in accordance with some embodiments of the disclosure.

FIG. 5 is a flow chart of the control method of the data storage system A1 in accordance with some embodiments of the disclosure. After the setting phase is finished, the initial phase of the control method of the data storage system A1 (step S201), the judging phase (steps S203 to S209), and the protection phase (step S211) may be performed.

In step S201, the data storage system A1 starts operating. In some embodiments, external electronic devices can be connected to the data storage system A1 via the Internet, thereby enabling the storage devices 22 to operate.

In step S203, the control device 2 determines whether the storage devices 22 are overheated. When there is at least one storage device 22 that has overheated, step S205 may be performed. When there are no storage devices 22 that have overheated, step S207 may be performed. In general, each storage device 22 may have the function of temperature detection. For example, a temperature sensor of the storage device 22 can detect the operating temperature inside the storage device. Therefore, the control device 2 can be connected to the storage devices 22 to obtain the operating temperature of the storage devices 22.

In the embodiment, the control device 2 may obtain the operating temperatures of each storage device 22 at predetermined intervals. For example, the predetermined intervals may be 10 seconds, but it is not limited thereto. When the operating temperature of one or more storage devices 22 exceeds the critical temperature value, the control device 2 determines that the one or more storage devices 22 are overheated storage devices.

In step S205, the control device 2 increases the rotation speed of the fan 23 closest to the overheated storage device 22 in the arrangement direction D1, so as to prevent the abnormal operation or damage of the overheated storage device 22. For example, as shown in Table 1 and FIG. 3, when only the storage device 22, that is the first one on the left of the second row R2 is overheated, the rotation speed of the fan 23a is increased in order to dissipate heat for the overheated storage device 22, but the rotation speed of the fans 23b, 23c and 23d may not be increased. Therefore, in the embodiment, the resonance due to the fans 23 may be avoided by avoiding increasing the rotation speed of all the fans 23a, 23b, 23c and 23d at the same time.

In some embodiments, each time step S205 is executed, the control device 2 may increase the rotation speed of the fan 23 by 10%, thereby gradually increasing the airflow generated by the fan 23. In the embodiment, the rotation speed of the fan 23 is not increased too fast at any one time so as to prevent the fan from resonating with the data storage module 20. In the embodiment, step S207 may be performed after step S205. In other embodiments, step S205 may be performed to return to step S201 or step 203.

In step S207, the control device 2 obtains an actual performance value of each storage device 22. In some embodiments, the actual performance value is the read/write speed of the storage devices 22 in operation. For example, the actual performance value of one of the storage devices 22 may be 80 MB/s.

After that, the control device 2 obtains the performance comparison value of each storage device 22 according to the actual performance value and the benchmark performance thereof. In the embodiment, the performance comparison value may be the rate of decline in performance. The performance comparison value of each storage device 22 can be obtained from the difference between the benchmark performance and the actual performance value thereof.

For example, the performance comparison value of each storage device 22 may be ((A−B)/A)*100%, wherein "A" is the benchmark performance thereof, and "B" is the actual performance value corresponding thereof. For example, the benchmark performance of the storage device 22, that is the first one on the left of the third row R3, is 100 MB/s, and the actual performance value of the storage device 22 is 95 MB/s. The performance comparison value of the storage device 22, that is the first one on the left of the third row R3, is 5% after calculating by the formula. In some embodiments, the formula may be (A−B)/A.

Table 2 is a comparison table of the storage devices 22 and performance comparison values in accordance with some embodiments according to FIG. 3. In Table 2, the rotation speed of the fans 23 may be 10000 rmp. In Table 2, the greater the performance comparison value, the more the operational efficiency of the corresponding storage device 22 drops.

TABLE 2

|  | fan 23a | | fan 23b | | fan 23c | | fan 23d | |
|---|---|---|---|---|---|---|---|---|
| first row R1 | 98% | 99% | 98% | 93% | 96% | 85% | 88% | 98% |
| second row R2 | 7% | 8% | 6% | 7% | 6% | 8% | 12% | 6% |
| third row R3 | 5% | 5% | 0% | 0% | 6% | 6% | 5% | 5% |
| fourth row R4 | 7% | 5% | 5% | 6% | 6% | 6% | 5% | 6% |
| fifth row R5 | 6% | 4% | 6% | 6% | 3% | 2% | 6% | 3% |
| sixth row R6 | 5% | 6% | 5% | 5% | 6% | 6% | 4% | 5% |
| correlation coefficient | 0.66 | 0.66 | 0.63 | 0.64 | 0.66 | 0.68 | 0.70 | 0.66 |

In step S209, the control device 2 obtains correlation coefficients corresponding to the storage devices 22 according to the position parameter of Table 1 and the performance comparison value of Table 2. In the embodiment, the control device 2 calculates each correlation coefficients (as shown in Table 2) from the position parameters and the performance comparison values of the storage devices 22 in the arrangement direction D1 by a conventional statistical formula. In other words, the storage devices 22 in each column correspond to one correlation coefficient.

If the storage device 22 is affected by the resonance of the fans 23 and the operational efficiency of the storage device 22 is decreased, the closer the storage device 22 is to the fan 23 in the arrangement direction D1, the more the operational efficiency of the storage device 22 may decrease. Therefore, when the performance comparison values of the storage devices 22 in the arrangement direction D1 is positively correlated with the position parameters, and the correlation coefficient is greater than a predetermined correlation value, the operational efficiency of the storage device 22 may be decreased due to the resonance of the fan 23, and thus step S211 may be performed. In the embodiment, the predetermined correlation value may be 0.6.

In the embodiment, the performance comparison value is positively correlated with the position parameter, and it is indicated that the closer the storage device 22 is to the fan 23 in the arrangement direction D1, the more its performance comparison value has. For example, in the embodiment, the performance comparison values of the storage devices 22 in the first row R1 are significantly larger than the performance comparison values of the storage devices 22 in the second row R2 to the sixth row R6, so the performance comparison values are positively correlated with the position parameters.

When the performance comparison value of the storage devices 22 in the arrangement direction D1 are negatively correlated with the position parameters, or the correlation coefficient is less than the predetermined correlation value, the operation efficiency of the storage devices 22 may not affected by the resonance of the fan 23, and can be returned to step S201.

Figure 6:
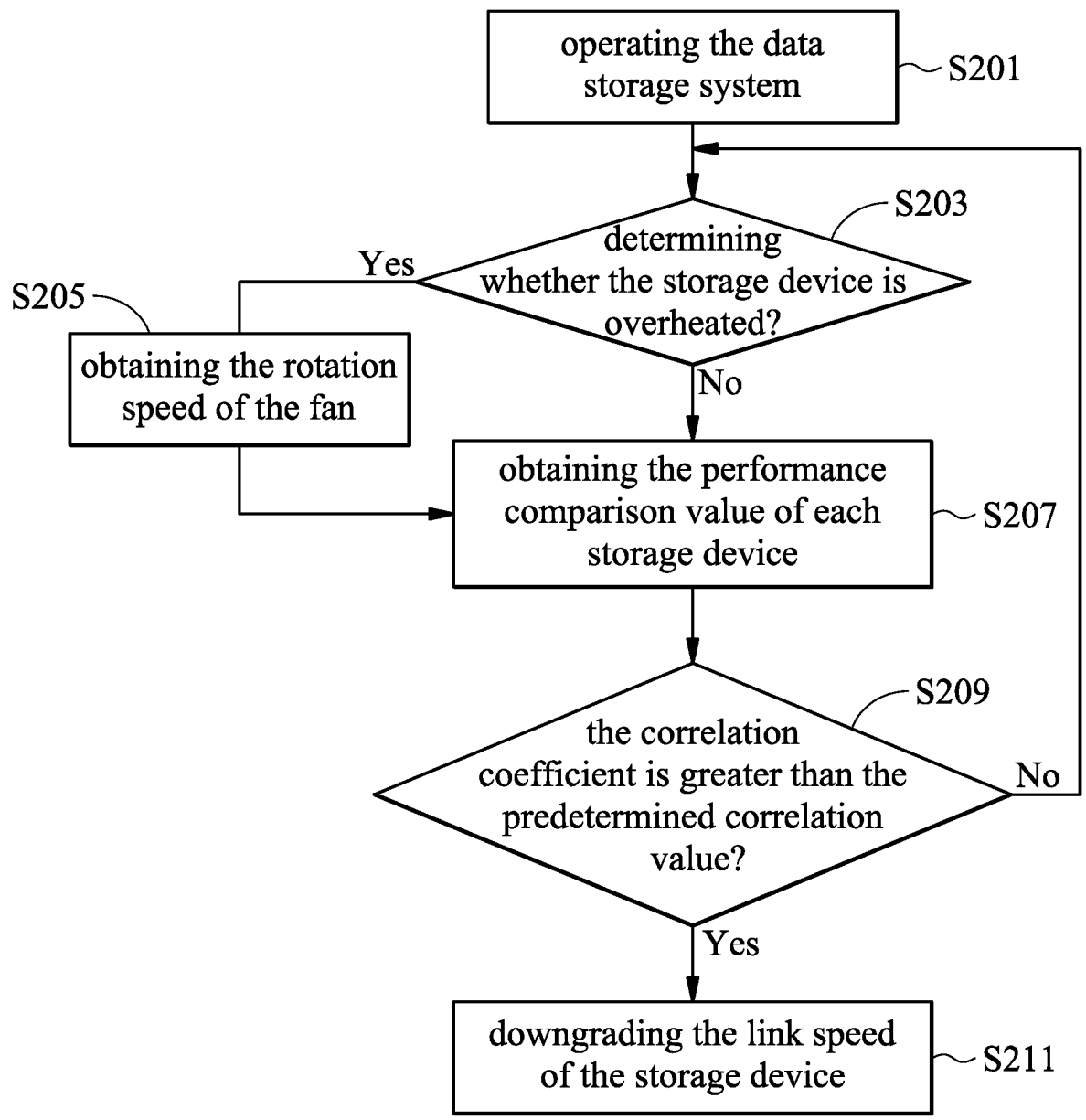
FIG. 6 is a flow chart of the control method of the data storage system in accordance with some embodiments of the disclosure.

FIG. 6 is a flow chart of the control method of the data storage system A1 in accordance with some embodiments of the disclosure. In step S209, when the operational efficiency of the storage device 22 is not affected by the resonance of the fans 23, it may return to step S203 in time. Therefore, in the embodiment, the control device 2 can directly perform the step of determining whether the storage device 22 is overheated, so as to instantly detect the operation state of the data storage module 20.

In step S211, when the performance comparison values of the storage devices 22 in the arrangement direction D1 is positively correlated with the position parameters, and the correlation coefficient is greater than the predetermined correlation value, the link speed of one of the storage devices 22 in the arrangement direction D1 is adjusted via the control device 2.

In some embodiments, the control device 2 can downgrade the transmission specification of the storage device 22 to achieve the purpose of downgrading the link speed of the storage device 22. For example, the control device 2 can downgrade the transmission specification SAS-4 of the storage device 22 to SAS-3, thereby downgrading the link speed of storage device 22.

In general, the vibration of the fans 23 affects the operation of the storage device 22. When the transmission speed of the storage device 22 is faster, the fault tolerance of the storage device 22 for the digital data transmission is lower. Moreover, when the storage device 22 is further affected by the vibration, it is easy to greatly increase the error rate or even damage the storage device 22. Therefore, downgrading the link speed of the storage device 22 can reduce the error rate. Moreover, since the rotation speed of the storage device 22 is decreased by downgrading the link speed, the resonance frequency of the storage device 22 is changed so as to reduce the resonance effect caused by the vibration of the fans 23.

In some embodiments, the control device 2 can downgrade the link speed of the storage devices 22 such as the storage devices 22 in the first row R1 in Table 2, which have the greatest performance comparison value of the storage devices 22 in the arrangement direction D1. In some embodiments, the control device 2 may downgrade the link speed of the storage devices 22 such as the storage devices 22 of the first row R1 in Table 2, which are closest to the fans 23.

When the link speed of the storage devices 22 are downgraded, the performance comparison value corresponding to the storage devices 22 are improved. For example, in Table 2, the performance comparison values of the storage devices 22 in the first row R1 can be improved to between 10% and 60%, which improves the efficiency of the data storage module 20.

In some embodiments, the control device 2 can be adjust further or reduce the rotation speed of the fan 23, whose correlation coefficient is greater than the predetermined correlation value, in an arrangement direction D1, so as to reduce the resonance of the fans 23. In some embodiments, each time step S211 is executed, the control device 2 can reduce the rotation speed of the fan 23 by 10%, so as to avoid the danger of the storage device 22 overheating due to the rotation speed of the fans 23 falling too much at one time.

After step S211 is performed, the method may return to step S201 to monitor the operational efficiency of the data storage module 20. In addition, the control device 2 may record the adjustment parameters of the related fans 23 and the storage devices 22. Therefore, the data storage module 20 can speed up the adjustment of the data storage module 20 when a similar situation occurs.

In conclusion, the control device of the present disclosure can detect whether the operational efficiency of the storage device is caused by the resonance of the fan. If the operational efficiency of the storage device is reduced by the resonance of the fan, the link speed of some storage devices can be adjusted, or the rotation speed of the fan can be further adjusted so as to improve the overall performance of the data storage system.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A control method of a data storage system, comprising:
   obtaining a correlation coefficient of a plurality of storage devices using a control device; and
   adjusting a link speed of one of the storage devices using the control device according to the correlation coefficient of the plurality of storage devices;
   wherein the link speed is a transmission speed between the plurality of storage devices and at least one external electronic device.

2. The control method of the data storage system as claimed in claim 1, wherein the storage devices are hard-disk drives.

3. The control method of the data storage system as claimed in claim 1, wherein the correlation coefficient corresponds to a plurality of performance comparison values and a plurality of position parameters of the storage devices, and each of the position parameters corresponds to a distance between each storage device and a fan, wherein the control device downgrades the link speed according to the correlation coefficient.

4. The control method of the data storage system as claimed in claim 3, further comprising:
   setting the position parameters for each of the storage devices via the control device; and
   obtaining the performance comparison values of each of the storage devices via the control device.

5. The control method of the data storage system as claimed in claim 1, wherein the link speed is downgraded in response to the correlation coefficient is greater than a predetermined correlation value.

6. The control method of the data storage system as claimed in claim 1, further comprising reducing a rotation speed of a fan by the control device according to the correlation coefficient.

7. The control method of the data storage system as claimed in claim 1, further comprising:
   obtaining a plurality of critical temperature values of the storage devices via the control device; and
   increasing a rotation speed of a fan using the control device in response to an operating temperature of the one of the storage devices operates exceeds the critical temperature value of the one of the storage devices.

8. The control method of the data storage system as claimed in claim 3, further comprising:
   obtaining a plurality of benchmark performance values of the storage devices;
   obtaining a plurality of actual performance values of the storage devices; and
   obtaining the performance comparison values of the storage devices using the control device according to the actual performance values and the benchmark performance values.

9. The control method of the data storage system as claimed in claim 8, wherein the performance comparison value of the one of the storage devices is obtained by the difference between the benchmark performance and the actual performance value of the one of the storage devices.

10. The control method of the data storage system as claimed in claim 8, wherein the distance between the one of the storage devices that is downgraded by the link speed and the fan is less than the distances between remaining storage devices and the fan.

11. The control method of the data storage system as claimed in claim 8, wherein the performance comparison value of the one of the storage devices that is downgraded by the link speed is greater than performance comparison values of remaining storage devices.

12. A data storage module, comprising:
    a plurality of storage devices;
    a plurality of fans adjacent to the storage devices; and
    a control device electrically connected to the storage devices and the fans;
    wherein the storage devices and one of the fans are sequentially arranged in an arrangement direction;

wherein the control device adjusts a link speed of one of the storage devices and a rotation speed of the one of the fans according to a correlation coefficient of the storage devices;

wherein the link speed is a transmission speed between the plurality of storage devices and at least one external electronic device.

13. The data storage system as claimed in claim 12, further comprising a housing detachably disposed in a chassis, wherein the storage devices and the fans are disposed in the housing.

14. The data storage system as claimed in claim 12, wherein each of the storage devices corresponds to a performance comparison value and a position parameter, and each of the position parameters corresponds to a distance between a storage device and the one of the fans, wherein the performance comparison values and the position parameters correspond to the correlation coefficient.

15. A computer program product, wherein the computer program product is loaded via a processor to execute the control method of the data storage system as claimed in claim 1.

* * * * *